United States Patent [19]
Maeda et al.

[11] Patent Number: 5,406,115
[45] Date of Patent: Apr. 11, 1995

[54] SEMICONDUCTOR DEVICE INCLUDING BIPOLAR TRANSISTOR HAVING SHALLOWED BASE AND METHOD FOR MANUFACTURING THE SAME

[75] Inventors: Takeo Maeda, Tokyo; Hiroshi Gojohbori, Yokohama; Yoshitaka Tsunashima, Tokyo, all of Japan

[73] Assignee: Kabushiki Kaisha Toshiba, Kawasaki, Japan

[21] Appl. No.: 52,919

[22] Filed: Apr. 27, 1993

[30] Foreign Application Priority Data

Apr. 28, 1992 [JP] Japan ................... 4-109596

[51] Int. Cl.⁶ ............... H01L 29/72; H01L 27/02
[52] U.S. Cl. ............... 257/592; 257/593; 257/370; 257/640; 257/378; 437/954; 437/950
[58] Field of Search ........... 437/950, 954; 257/592, 257/593, 370, 640, 378

[56] References Cited

U.S. PATENT DOCUMENTS

| | | | |
|---|---|---|---|
| 4,569,123 | 2/1986 | Ishii et al. | 257/593 |
| 4,692,786 | 9/1987 | Lindenfelser | 257/640 |
| 5,015,594 | 5/1991 | Chu et al. | 257/370 |
| 5,065,222 | 11/1991 | Ishii | 257/640 |
| 5,192,992 | 3/1993 | Kim et al. | 257/370 |

FOREIGN PATENT DOCUMENTS

| | | | |
|---|---|---|---|
| 1-205522 | 8/1989 | Japan | 437/950 |
| 3-214725 | 9/1991 | Japan | 437/950 |

*Primary Examiner*—Jerome Jackson
*Assistant Examiner*—John Guay
*Attorney, Agent, or Firm*—Finnegan, Henderson, Farabow, Garrett & Dunner

[57] ABSTRACT

A semiconductor device of this invention includes an N-type semiconductor region functioning as a collector of a bipolar transistor, a silicon dioxide film doped with boron and formed in contact with the surface of the N-type semiconductor region, a P-type semiconductor region formed in contact with the silicon dioxide film doped with boron in the N-type semiconductor region and functioning as a base of the bipolar transistor, and an N-type semiconductor region formed in the P-type semiconductor region and functioning as an emitter of the bipolar transistor.

10 Claims, 6 Drawing Sheets

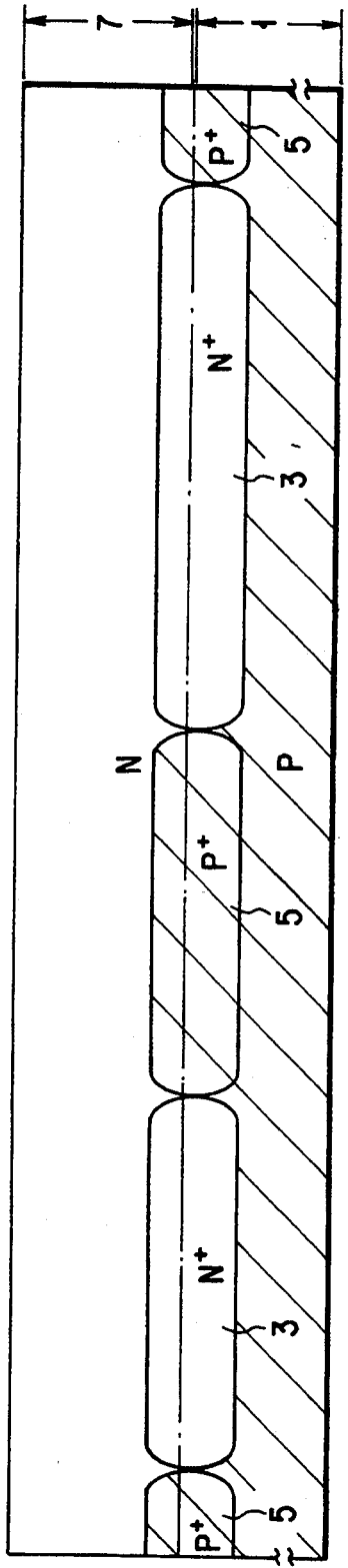
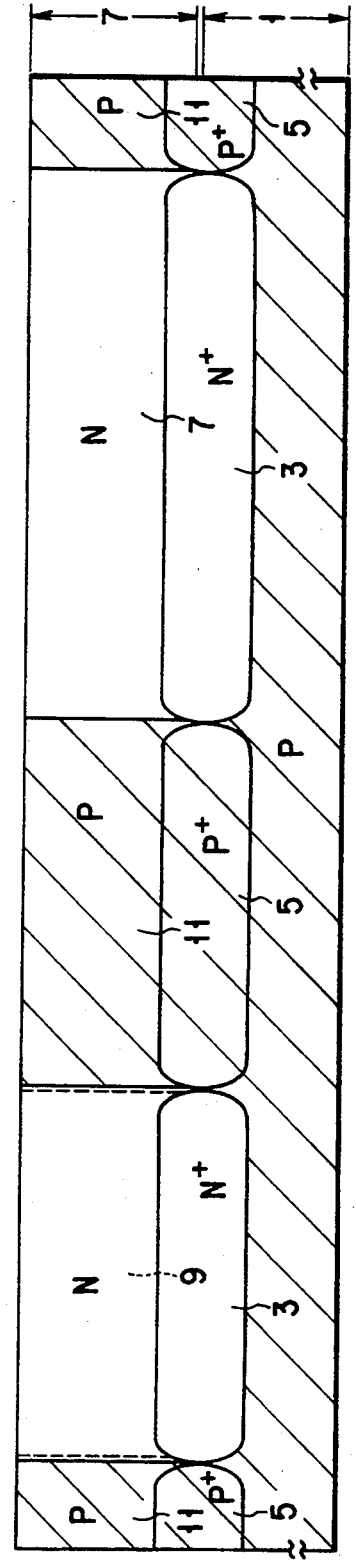
FIG. 1A
FIG. 1B

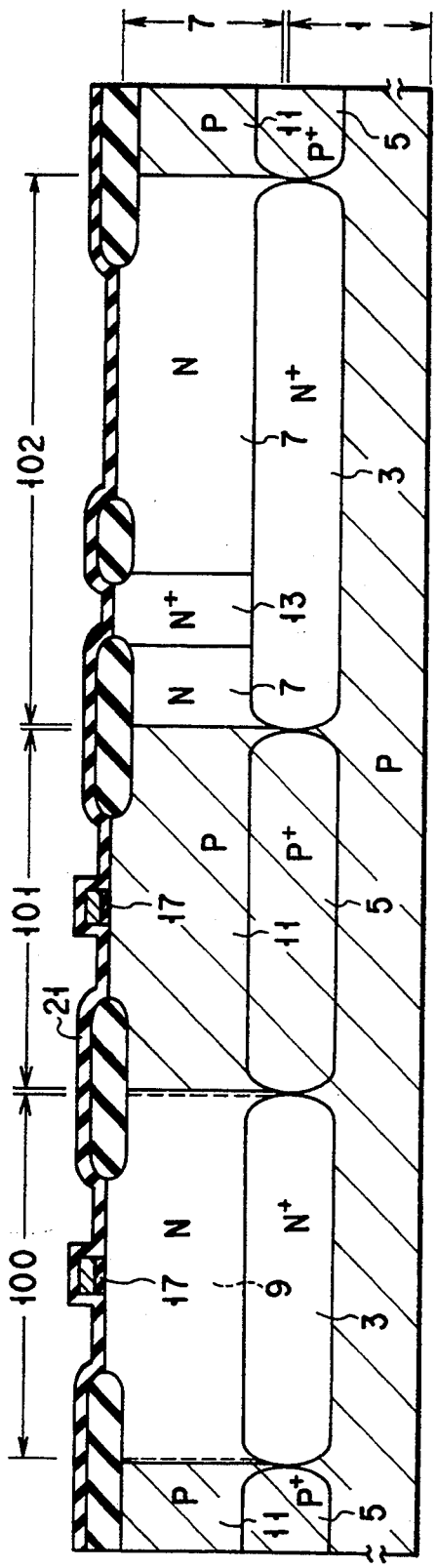
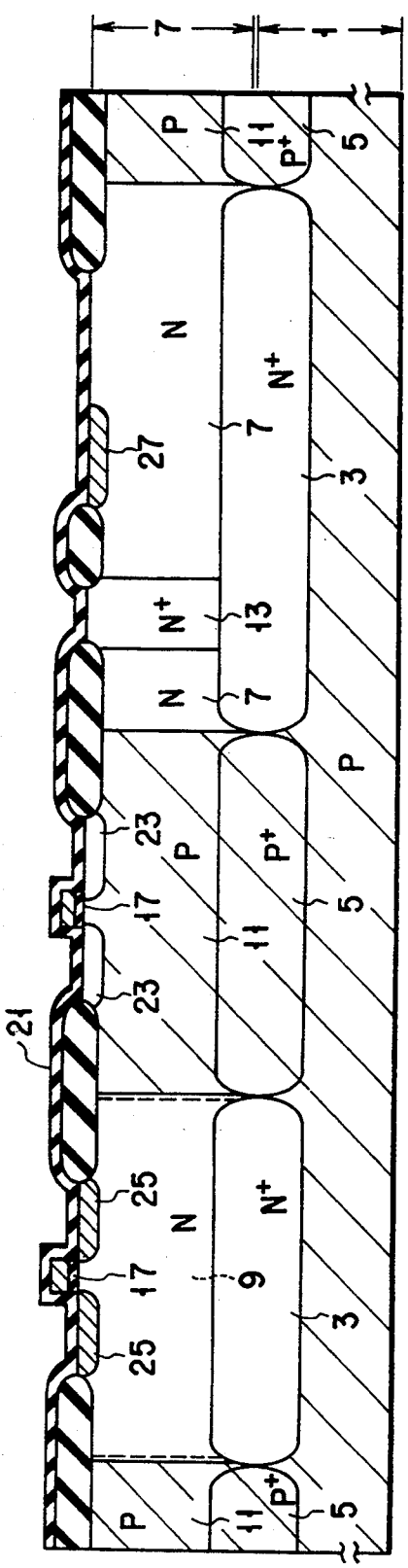
FIG. 1C
FIG. 1D

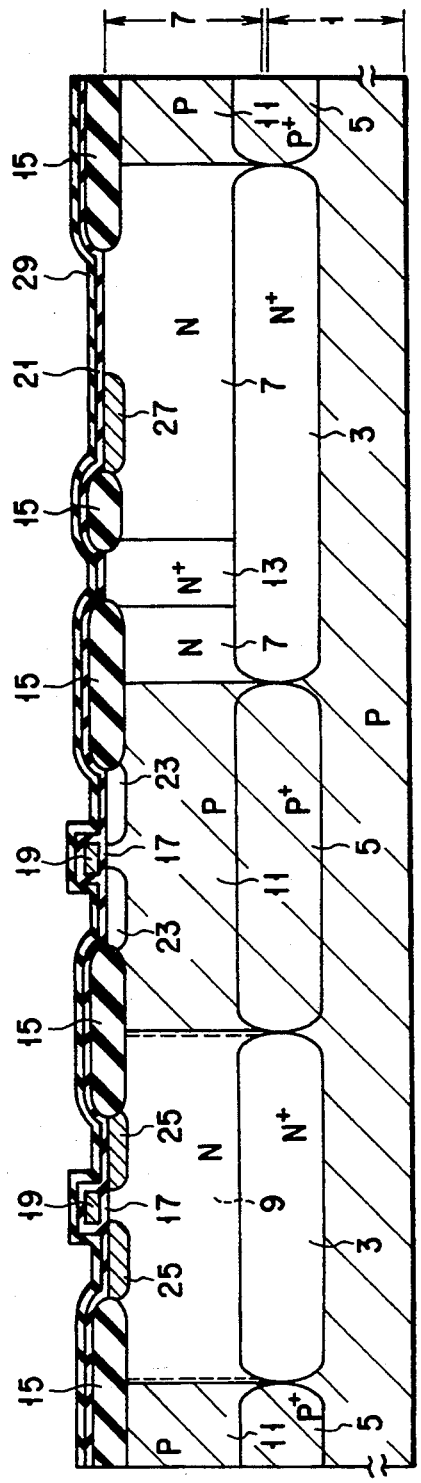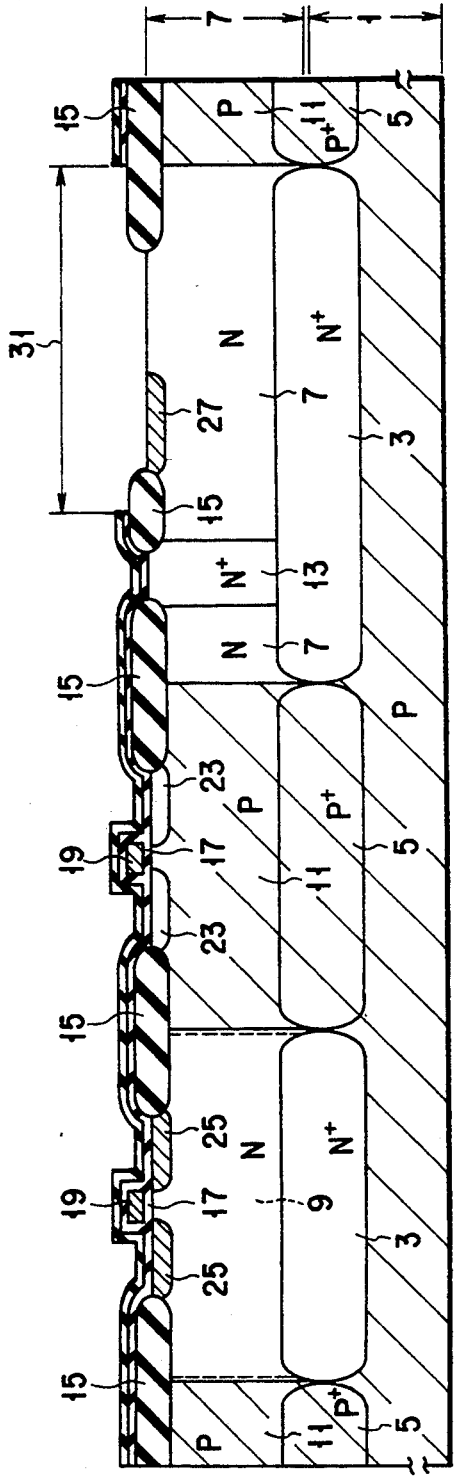
FIG. 1E
FIG. 1F

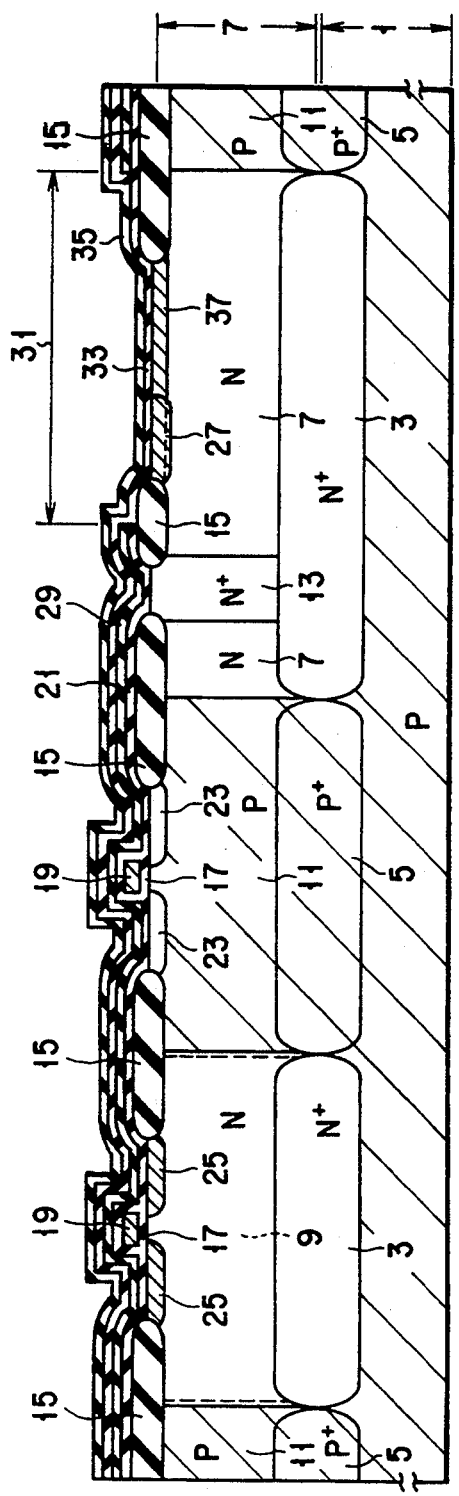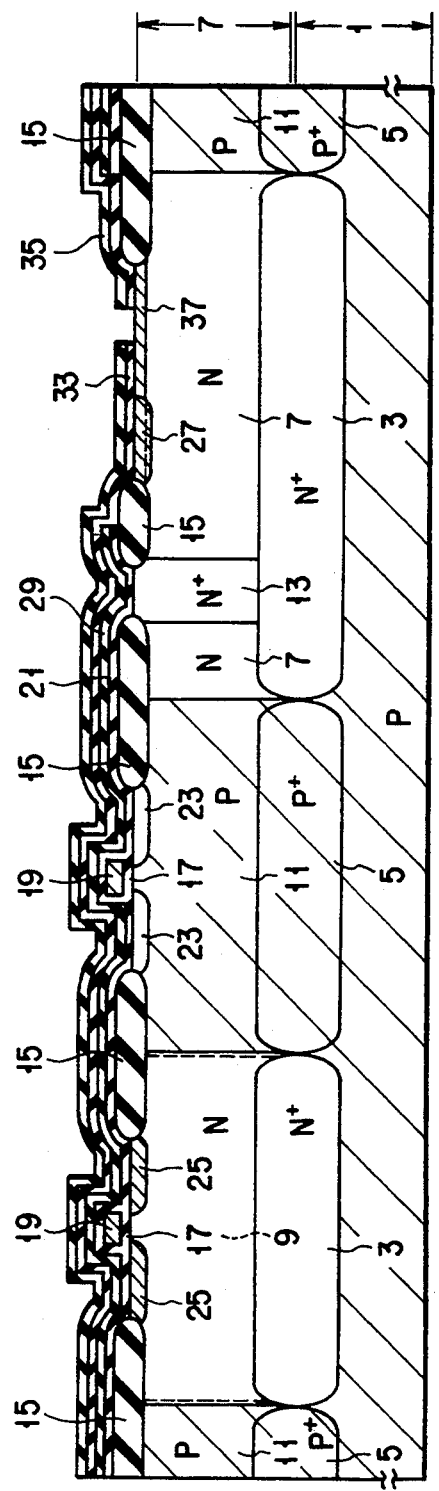
FIG. 1G
FIG. 1H

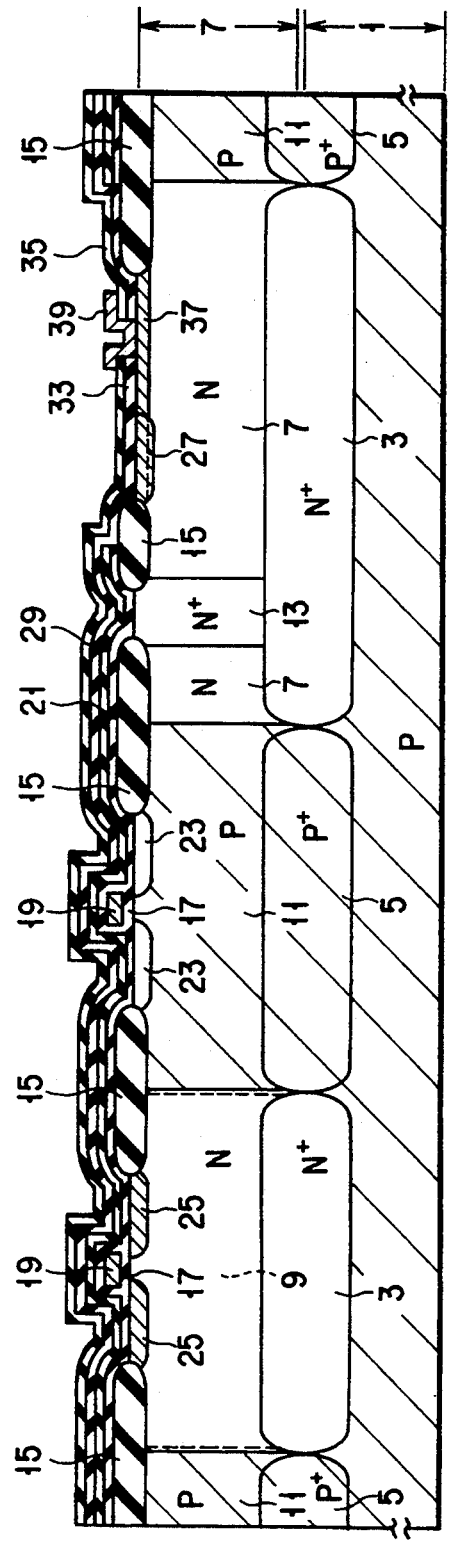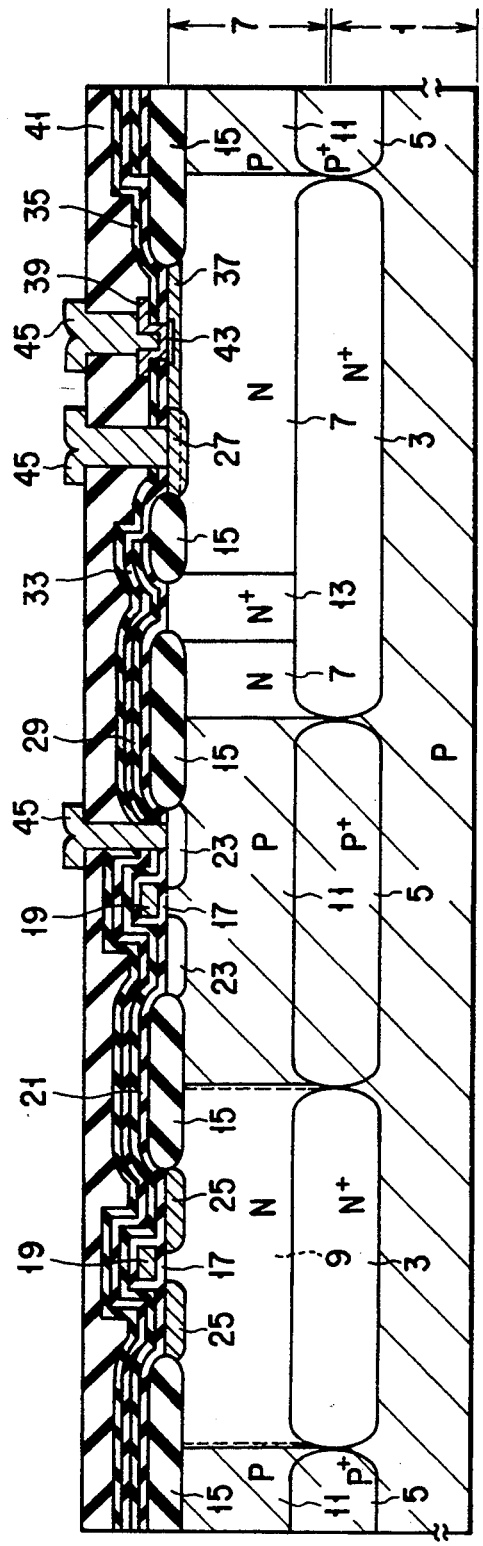

SEMICONDUCTOR DEVICE INCLUDING BIPOLAR TRANSISTOR HAVING SHALLOWED BASE AND METHOD FOR MANUFACTURING THE SAME

BACKGROUND OF THE INVENTION

1. Field of the Invention

This invention relates to a semiconductor device and a method for manufacturing the same, and more particularly to a semiconductor device including a bipolar transistor having a shallowed base whose width is reduced and a method for manufacturing the same.

2. Description of the Related Art

The high-frequency characteristic of a bipolar transistor depends on the base width.

In the conventional technique, the intrinsic base region is formed by implanting impurities such as boron (B) or boron fluoride ($BF_2$) into a silicon substrate. When the base junction is set in a shallow position by use of the above technique, the ion implantation energy is lowered. By lowering the implantation energy, the impurity injection distance from the surface of the substrate can be made short and a base with a shallow base junction can be formed.

However, the above ion implantation technique has a problem of channeling phenomenon. The channeling phenomenon is that impurities are implanted into a position which is deeper than the implantation depth theoretically estimated from the physical energy of the implanted impurities. Such a phenomenon becomes significant when impurities such as boron having low atomic weight are used. When this phenomenon occurs, it becomes possible to make the junction position shallow even if the implantation energy is lowered to the lowest possible level. Further, the upper limit of the implantation energy itself in the manufacturing process is set to 10 KeV when taking the ion beam current into consideration. This means that the improvement of the performance of the bipolar transistor which has been attained by making the base junction shallow (or shallowing the base junction) is approaching its limitation.

SUMMARY OF THE INVENTION

A first object of this invention is to provide a bipolar transistor which is excellent in the high-frequency characteristic by realizing a novel technique which makes it possible to further shallow the base and a method for manufacturing the same.

A second object of this invention is to provide a Bi-MOS semiconductor device in which an integrated circuit can be constructed by insulated gate FETs and bipolar transistors which are excellent in the high-frequency characteristic and a method for manufacturing the same.

A third object of this invention is to provide a semiconductor device in which impurities can be diffused into only a selected portion from a film serving as an impurity source and the impurity source film can be left behind and a method for manufacturing the same.

A fourth object of this invention is to provide a Bi-MOS semiconductor device in which an integrated circuit can be constructed by insulated gate FETs whose characteristics are less subject to variation and bipolar transistors which are excellent in the high-frequency characteristic by realizing a technique of diffusing impurities into only a selected portion from a film serving as an impurity source while preventing the source and drain of the insulated gate FET from drooping 10 and a method for manufacturing the same.

In order to attain the above objects, in a semiconductor device and a method for manufacturing the same according to this invention, an impurity source film having impurities of a second conductivity type doped therein is provided on the main surface of a semiconductor body of a first conductivity type functioning as a first electrode layer of a bipolar transistor, impurities of the second conductivity type are diffused into the semiconductor body from the impurity source film to form a first semiconductor region of the second conductivity type functioning as a base of the bipolar transistor in the semiconductor body, and a second semiconductor region of the first conductivity type functioning as a second electrode layer of the bipolar transistor is provided in the first semiconductor region.

According to the above semiconductor device and manufacturing method thereof, since the first semiconductor region of the second conductivity type functioning as the base of the bipolar transistor is formed by diffusing impurities of the second conductivity type from the impurity source film, the base having such a shallow junction depth that cannot be attained by the ion-implantation technique can be obtained. Thus, in the bipolar transistor having the shallowed base, the base width can be further reduced so that an excellent high-frequency characteristic can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1J are cross sectional views showing a manufacturing method in an order of the steps for manufacturing a semiconductor device according to one embodiment of this invention.

DETAILED DESCRIPTION OF THE PREFERRED EMBODIMENTS

Figure 2:
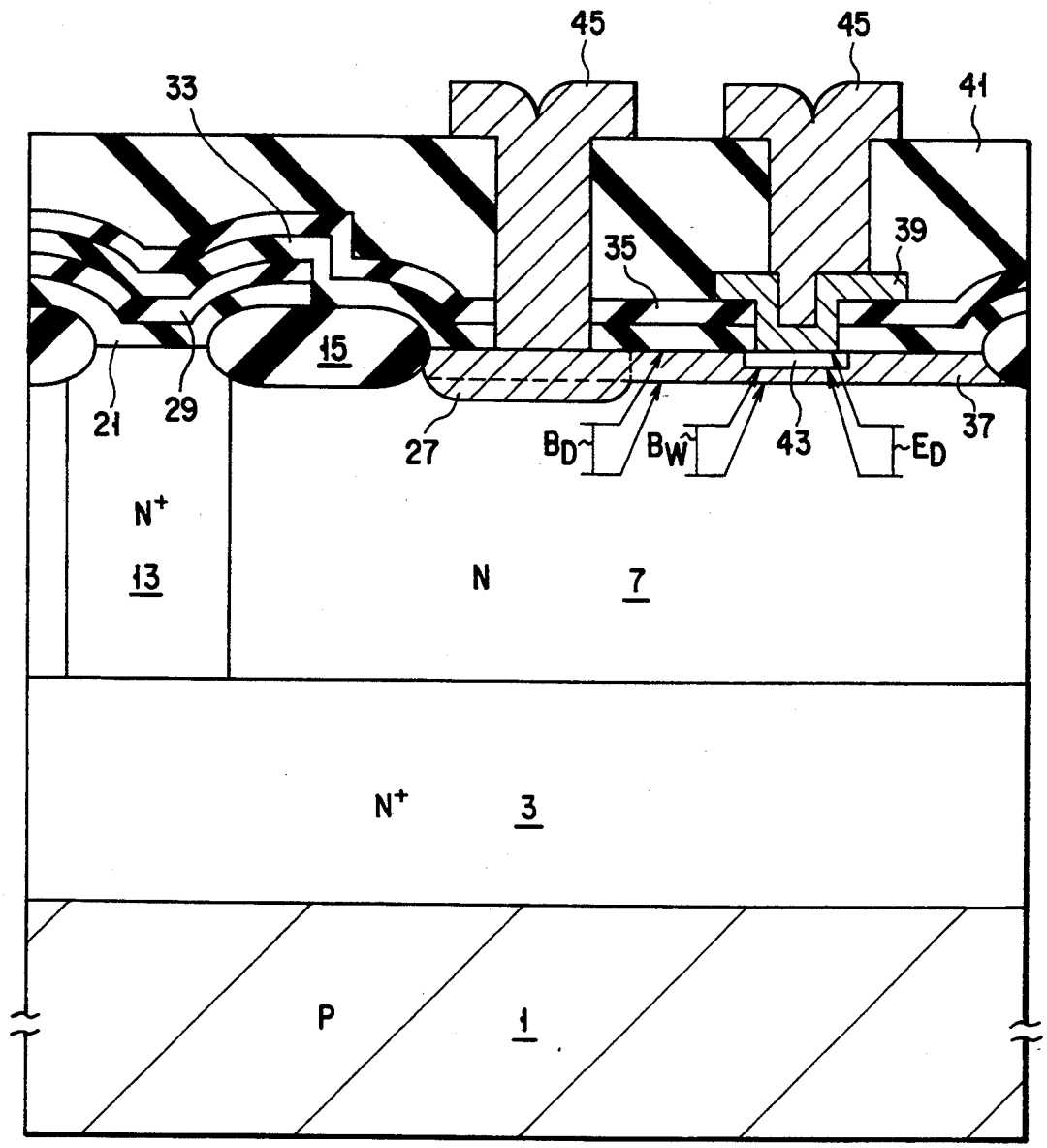
FIG. 2 is a cross sectional view showing a portion obtained by enlarging a bipolar transistor shown in FIG. 1J.

There will now be described an embodiment of this invention with reference to the accompanying drawings.

FIGS. 1A to 1J are cross sectional views showing a manufacturing method in an order of the steps for manufacturing a semiconductor device according to one embodiment of this invention.

First, an N+-type buried layer 3 and a P+-type buried layer 5 are formed in the surface area of a P-type semiconductor substrate 1, for example. Then, an N-type epitaxial layer 7 is formed on the substrate 1 (FIG. 1A).

Next, an N-type well 9 reaching the N+-type buried layer 3 in an N-channel MOSFET forming section and a P-type well 11 reaching the P+-type buried layer 5 in an N-channel MOSFET forming section are formed in the epitaxial layer 7. Another portion of the epitaxial layer 7 will become an NPN-bipolar transistor forming section (FIG. 1B).

After this, a field insulation film (SiO$_2$) 15 is formed in the surface area of the epitaxial layer 7. Thus, a P-channel MOSFET forming area 100, N-channel MOSFET forming area 101 and NPN bipolar transistor forming area 102 can be formed. Next, an N+-type collector lead-out region 13 is formed. Then, impurities of respective conductivity types (at least one of N-and P-type) are ion-implanted (channel ion-implantation step) into the channel portions of the P-and N-channel MOSFETs. Next, gate insulation films (SiO$_2$) 17 are formed on the surface of the epitaxial layer 7 and then gate electrodes 19 are formed. After this, after-oxidation such as oxide film formation by the thermal oxidation or CVD method is effected to form a silicon oxide film (SiO$_2$) 21 on the surface of the epitaxial layer 7 and gate electrodes 19 (FIG. 1C).

Next, impurities of respective conductivity types are ion-implanted into the epitaxial layer 7 to form N+-type source/drain regions 2B, P+-type source/drain regions 25 and a P+-type outer base region 27 (FIG. 1D).

Next, an insulation film 29 formed of at least one of a silicon nitride film (SiN$_x$) and silicon oxide film (SiO$_2$) with a thickness of approx. 10 to 2000 angstrom is formed on the silicon oxide film 21. Since the insulation film 29 is formed to prevent boron from penetrating into the MOSFET forming area, it is required to form the insulation film by use of a material which has a property for making it difficult for boron to pass therethrough (FIG. 1E).

Next, a photoresist pattern (not shown) is formed on the insulation film 29 and at least portions of the insulation film 29 and silicon oxide film 21 which lie on the base/emitter forming area 31 are removed by use of the chemical etching method such as the reactive ion etching (RIE) method or chemical dry etching (CDE) method with the photoresist pattern used as a mask. As a result, in the base/emitter forming area 31, the surface of the epitaxial layer 7 is partly exposed (FIG. 1F).

Next, after the photoresist (not shown) is removed, a CVD silicon oxide film doped with boron (which is, for example, a boron doped SiO$_2$ film or BSG film and is referred to as doped glass film) 33 is formed on the entire upper surface of the epitaxial layer 7 and a CVD silicon oxide film doped with no impurity (which is a non-doped SiO$_2$ film and is referred to as a non-doped oxide film) 35 is successively formed on the doped glass 33 in the same furnace. At this time, the boron concentration of the doped glass film 33 is set to approx. $1 \times 10^{20}$ to $5 \times 10^{21}$ cm$^{-3}$ and the film thickness thereof is set to approx. 100 to 1000 angstrom. Then, the heat treatment is effected at a temperature of 850° C. for 5 to 60 minutes in an atmosphere containing at least one of nitrogen, oxygen and hydrogen. As a result, boron is diffused from the doped glass film 33 into a portion of the epitaxial layer 7 which lies in the base/emitter forming area 31 to form a P-type base region (intrinsic base region) 37. Since the insulation film 29 acts as a barrier for preventing diffusion of boron, boron will not be doped into that portion which is covered with the insulation film 29, for example, the well 9 and well 11 (FIG. 1G).

In the above diffusion process, if the diffusion is effected particularly in the atmosphere containing oxygen or hydrogen, an effect (diffusion speed increasing effect) that the speed of diffusion of boron into the epitaxial (Si) layer 7 is adequately increased can be attained and a desired impurity profile can be obtained in a short period of time, for example. Further, the silicon nitride film (SiN$_x$) has a function of suppressing the diffusion speed increasing effect. Therefore, if the insulation film 29 is formed of a silicon nitride film (SiN$_x$), an effect that the impurity profiles in both of the formation areas for the P-channel and N-channel MOSFETs tend to become difficult to droop can be obtained.

Further, as the heat treatment in the above diffusion process, a so-called rapid annealing process using an instantaneous diffusion furnace may be used in addition to the above process. An example of the condition for the annealing process is that the temperature is set at 1050° C. and the period for the process is set to 20 seconds or less.

Next, a photoresist pattern (not shown) is formed on the non-doped oxide film 35 and the doped glass 33 and non-doped oxide film 35 are etched by use of the RIE method to form an emitter opening portion with the photoresist pattern used as a mask (FIG. 1H).

Next, after the photoresist pattern (not shown) is removed, a polysilicon film with a thickness of approx. 1000 to 3000 angstrom is formed on the non-doped oxide film 35. The polysilicon film is formed in contact with the internal base region 37 via the emitter opening portion. After this, the polysilicon film is patterned to form a polysilicon emitter electrode 39. The polysilicon emitter electrode 39 may be formed of a laminated layer (polycide) of a silicide film and a polysilicon film. Then, arsenic (As) which is used as an impurity for forming the emitter is ion-implanted (one example of the ion-implantation is that the acceleration voltage is 40 KeV and the dose amount is $1 \times 10^{16}$ cm$^{-2}$) into the polysilicon emitter electrode 39 (FIG. 1I).

Next, a non-doped oxide film SiO$_2$ and a BPSG film are formed on the non-doped oxide film 35 and polysilicon emitter electrode 39 to form an inter-level insulation film 41. Then, the heat treatment (one example of the condition thereof is that the temperature is 850° C. and the period therefor is 30 to 100 minutes) is effected as the reflow process for the BPSG film. At this time, for example, arsenic implanted into the polysilicon emitter electrode 39 is diffused into the internal base region 37 to form an N+-type emitter region 43 in the internal base region 37. Then, contact holes are formed in the inter-level insulation film 41 to reach desired regions of the device and an aluminum film is formed on the inter-level insulation film 41. The aluminum film is made in contact with the source/drain regions 25 of the N-channel MOSFET, outer base region 27 and polysilicon emitter electrode 39 via the respective contact holes shown in the drawing. After this, the aluminum film is patterned to form aluminum wiring layers 45 (FIG. 1J).

By effecting the above steps, a Bi-CMOS semiconductor device according to one embodiment of this invention can be formed.

According to the Bi-CMOS semiconductor device with the above structure, boron is diffused from the doped glass film 33 into the collector region 7 to form the internal base region 37. That is, the internal base region 37 can be formed according to the principle of one type of solid-phase diffusion. Therefore, a problem of channeling which occurs when the ion-implantation technique is used will not significantly occur and the minimum impurity injection depth is not limited unlike the case of the ion-implantation technique. Therefore, the internal base region 37 has a junction depth shallower than the junction depth of the internal base region formed by the ion-implantation technique.

One example of the above effect is explained by referring to concrete numerals used in a Bi-CMOS semiconductor device in which the minimum formation size of the emitter opening portion is 0.8 μm or less and the minimum processable size for the gate length is 0.5 μm or less. FIG. 2 is a cross sectional view showing an enlarged portion of a transistor shown in FIG. 1J.

In the above embodiment, a bipolar transistor in which the junction depth $B_D$ is 0.18 μm or less, the junction depth $E_D$ of the emitter region 43 is 0.06 μm or less and the base width $B_W$ is 0.12 μm or less can be provided.

According to the conventional ion-implantation technique, the junction depth of the internal base from the surface of the substrate is 0.18 μm or more and the junction depth of the emitter region is 0.06 μm, and as a result, the base width will be set to 0.12 μm or more.

Since the base width can be set to 0.12 μm or less in the above embodiment, the cut-off frequency $f_T$ of the bipolar transistor can be enhanced from 7 GHz which is set in the conventional case to 15 GHz, thus improving the high-frequency characteristic.

Further, the technique which is called solid-phase diffusion was used as an ordinary impurity adding method in the semiconductor field before the ion-implantation technique was developed. However, at that time, since the desired junction depth was deeper than that in the above embodiment (more than 1 μm), the temperature set in the heat treatment after formation of the doped glass was extremely higher than that set in the above embodiment and time for the heat treatment was extremely long (for example, 1000° C. and 300 minutes or more). Further, since the doped glass came to have the hygroscopic property after the impurity was diffused and the characteristic of the device might be changed, the doped glass was removed. Removal of the doped glass requires an additional etching process which tends to lower the manufacturing yield and is not desirable in the manufacturing process for manufacturing fine integrated circuits.

The above embodiment also solves the above problem.

That is, it is important to make the junction depth shallow in this invention, and as a result, the heat treatment after formation of the doped glass can be effected at low temperatures for a short period of time. The step of removing the doped glass can be omitted by using the doped glass as an inter-level insulation film for isolating the internal base region 37 and the polysilicon emitter electrode 39 from each other, for example. The problem caused by the hygroscopic property of the doped glass is solved by forming a non-doped oxide film on the doped glass and successively forming non-doped glass on the doped glass, for example, without taking out the structure from the diffusion furnace. That is, the non-doped oxide film serves as a shielding film for preventing water from penetrating into the doped glass and the doped glass is formed without being exposed to the atmosphere by successively forming the non-doped oxide film on the doped glass without taking out the structure from the diffusion furnace. If the doped glass is formed without being exposed to the atmosphere, the doped glass will not absorb water in the atmosphere. Therefore, the doped glass will absorb substantially no water during the device manufacturing process and after the manufacturing process, thereby lowering the possibility that the characteristic of the device may be changed.

This invention has been explained with reference to one embodiment, but this invention is not limited to the above embodiment and can be variously modified without departing from the technical scope thereof. For example, the doped glass contains boron which is a P-type impurity, but in a case where a PNP bipolar transistor is formed, the doped glass may be formed to contain arsenic or phosphorus which is an N-type impurity.

Further, this invention can be applied to a two-layered polysilicon structure bipolar transistor (self-alignment type bipolar transistor). In this case, a first-layered polysilicon layer used for forming a base electrode is formed and then an insulation film such as a silicon oxide film is formed on the first-layered polysilicon layer. Then, a window for the emitter portion is formed in the first-layered polysilicon layer and silicon oxide film, doped glass is formed at least in the window, and after this, impurities for formation of a base are diffused from the doped glass. Next, the doped glass is subjected to the anisotropic etching process by use of the RIE method to leave part of the doped glass on the side surface of the window in the side wall form. After this, a second-layered polysilicon layer used for forming an emitter electrode is formed. According to the two-layered polysilicon structure bipolar transistor thus formed, at least the junction depth of the intrinsic base region can be made shallow. Further, since the doped glass used for base diffusion is used as an inter-level insulation film, it is not necessary to remove the doped glass.

Further, additional various modifications can be made.

As described above, according to this invention, a novel technique for further shallowing the base can be realized and a semiconductor device having a bipolar transistor which is excellent in the high-frequency characteristic and a method for manufacturing the same can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor body of a first conductivity type having a bipolar transistor forming region and an insulated-gate FET forming region;
   a first semiconductor region of a second conductivity type provided in a portion of said insulated-gate FET forming region;
   a second semiconductor region of the second conductivity type provided in said bipolar transistor forming region, said second semiconductor region functioning as a first electrode layer of a bipolar transistor;

a first insulated-gate FET of the second conductivity type provided in another portion of said insulated-gate FET forming region;

a second insulated-gate FET of the first conductivity type provided in said first semiconductor region;

an impurity shielding layer means having a property of hardly permitting passage of impurities of the first conductivity type and respectively provided over said first and second insulated-gate FETs;

an impurity source film means provided on at least said second semiconductor region and said impurity shielding layer means, having an insulating property and containing impurities of the first conductivity type;

a third semiconductor region of the second conductivity type provided in said second semiconductor region being in contact with said impurity source film means, said third semiconductor region containing the same impurity as the impurity of the second conductivity type contained in said impurity source film means, and functioning as a base of said bipolar transistor; and a fourth semiconductor region of the first conductivity type provided in said third semiconductor region and functioning as a second electrode layer of said bipolar transistor.

2. A device according to claim 1, wherein said first electrode layer is a collector of said bipolar transistor and said second electrode layer is an emitter of said bipolar transistor.

3. A device according to claim 1, wherein said impurity source film means is a laminated film formed of a doped film having impurities of the second conductivity type doped therein and provided on the main surface of said second semiconductor region and a non-doped film having no impurity doped therein and provided on said doped film.

4. A device according to claim 3, wherein said doped film is formed of silicon dioxide containing boron and said non-doped film is formed of silicon dioxide.

5. A device according to claim 1, further comprising:

an opening provided in said impurity source film means to expose part of the surface of said second semiconductor region; and a further impurity source film provided on said impurity source film means and being in contact with the surface of said second semiconductor region via said opening.

6. A device according to claim 5, wherein said further impurity source film is formed of a conductive material and functions as an emitter electrode of said bipolar transistor.

7. A device according to claim 6, wherein said impurity source film means functions as in inter-level insulation film for isolating said further impurity source film formed of said conductive material and said second semiconductor region from each other.

8. A device according to claim 6, wherein said impurity source film means is a laminated film formed of a doped film having impurities of the second conductivity type doped therein and provided on the surface of said second semiconductor region and a non-doped film having no impurity doped therein and provided on said doped film.

9. A device according to claim 8, wherein said doped film is formed of silicon dioxide containing boron and said non-doped film is formed of silicon dioxide.

10. A device according to claim 1, wherein said impurity shielding layer means is provided over said insulating-gate FET forming region, and thereby is provided over said first and second insulating-gate FETs.

* * * * *